(12) United States Patent
Briere

(10) Patent No.: US 9,219,058 B2
(45) Date of Patent: Dec. 22, 2015

(54) EFFICIENT HIGH VOLTAGE SWITCHING CIRCUITS AND MONOLITHIC INTEGRATION OF SAME

(75) Inventor: Michael A. Briere, Redondo Beach, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 13/020,243

(22) Filed: Feb. 3, 2011

(65) Prior Publication Data

US 2011/0210338 A1 Sep. 1, 2011

Related U.S. Application Data

(60) Provisional application No. 61/339,190, filed on Mar. 1, 2010.

(51) Int. Cl.
| | |
|---|---|
| *H01L 29/15* | (2006.01) |
| *H01L 27/06* | (2006.01) |
| *H01L 29/778* | (2006.01) |
| *H03K 17/567* | (2006.01) |
| *H01L 21/8258* | (2006.01) |
| *H01L 29/20* | (2006.01) |
| *H01L 27/088* | (2006.01) |

(52) U.S. Cl.
CPC ........ *H01L 27/0605* (2013.01); *H01L 21/8258* (2013.01); *H01L 27/0629* (2013.01); *H01L 29/7787* (2013.01); *H03K 17/567* (2013.01); H01L 27/0883 (2013.01); H01L 29/2003 (2013.01)

(58) Field of Classification Search
CPC .................................................. H01L 27/0605
USPC ........................................................... 257/76
See application file for complete search history.

(56) References Cited

U.S. PATENT DOCUMENTS

| | | | |
|---|---|---|---|
| 5,021,840 A | 6/1991 | Morris | |
| 6,433,396 B1 | 8/2002 | Kinzer | |
| 6,455,398 B1 * | 9/2002 | Fonstad et al. | ................ 438/459 |
| 7,498,617 B2 | 3/2009 | Kinzer | |
| 7,550,781 B2 | 6/2009 | Kinzer | |

(Continued)

FOREIGN PATENT DOCUMENTS

| | | |
|---|---|---|
| EP | 2 006 991 | 12/2008 |
| JP | 2009-4398 | 1/2009 |

(Continued)

*Primary Examiner* — Wael Fahmy
*Assistant Examiner* — Sarah Salerno
(74) *Attorney, Agent, or Firm* — Farjami & Farjami LLP

(57) ABSTRACT

A high voltage switching circuit includes first and second group III-V transistors, the second group III-V transistor having a greater breakdown voltage than the first group III-V transistor. The circuit further includes a silicon diode in a parallel arrangement with the first group III-V transistor, the parallel arrangement being in cascade with the second group III-V transistor. The circuit is effectively a three-terminal device, where a first terminal is coupled to a gate of the second III-V transistor, a source of the first III-V transistor, and an anode of the silicon diode. A second terminal is coupled to a gate of the first group III-V transistor, and a third terminal is coupled to a drain of the second group III-V transistor. The first group III-V transistor might be an enhancement mode transistor. The second group III-V transistor might be a depletion mode transistor. The first and second group III-V transistors can be GaN HEMTs.

18 Claims, 5 Drawing Sheets

(56) References Cited

U.S. PATENT DOCUMENTS

| | | |
|---|---|---|
| 7,745,849 B2 | 6/2010 | Briere |
| 7,839,131 B2 | 11/2010 | Yang |
| 7,863,877 B2 | 1/2011 | Briere |
| 7,902,809 B2 | 3/2011 | Briere |
| 7,915,645 B2 | 3/2011 | Briere |
| 7,964,895 B2 | 6/2011 | Briere |
| 7,999,288 B2 | 8/2011 | Briere |
| 7,999,289 B2 | 8/2011 | Suzuki |
| 8,063,616 B2 | 11/2011 | Bahramian |
| 8,072,202 B2 | 12/2011 | Yang |
| 8,076,699 B2 | 12/2011 | Chen |
| 8,084,785 B2 | 12/2011 | Briere |
| 8,093,597 B2 | 1/2012 | Briere |
| 8,138,529 B2 * | 3/2012 | Wu .............................. 257/268 |
| 8,148,964 B2 | 4/2012 | Briere |
| 8,159,003 B2 | 4/2012 | Briere |
| 8,168,000 B2 | 5/2012 | Briere |
| 8,174,051 B2 | 5/2012 | Cao |
| 8,183,595 B2 | 5/2012 | Briere |
| 8,216,951 B2 | 7/2012 | Cheng |
| 8,338,861 B2 | 12/2012 | Briere |
| 8,390,091 B2 | 3/2013 | Renaud |
| 8,395,132 B2 | 3/2013 | Briere |
| 8,399,912 B2 | 3/2013 | Cheah |
| 8,399,913 B2 | 3/2013 | Suzuki |
| 2005/0189562 A1 | 9/2005 | Kinzer |
| 2006/0043499 A1 * | 3/2006 | De Cremoux et al. ........ 257/401 |
| 2006/0175633 A1 | 8/2006 | Kinzer |
| 2006/0289876 A1 | 12/2006 | Briere |
| 2007/0000433 A1 | 1/2007 | Briere |
| 2007/0026587 A1 | 2/2007 | Briere |
| 2007/0077714 A1 | 4/2007 | Beach |
| 2007/0228422 A1 | 10/2007 | Suzuki |
| 2007/0228477 A1 | 10/2007 | Suzuki |
| 2008/0083932 A1 | 4/2008 | Briere |
| 2008/0087917 A1 | 4/2008 | Briere |
| 2008/0122418 A1 | 5/2008 | Briere |
| 2008/0136390 A1 | 6/2008 | Briere |
| 2008/0191216 A1 | 8/2008 | Machida |
| 2008/0315129 A1 | 12/2008 | Briere |
| 2008/0315257 A1 | 12/2008 | Shiraishi |
| 2009/0001424 A1 | 1/2009 | Cao |
| 2009/0050939 A1 | 2/2009 | Briere |
| 2009/0051225 A1 | 2/2009 | Yang |
| 2009/0065810 A1 * | 3/2009 | Honea et al. ................. 257/192 |
| 2009/0072273 A1 | 3/2009 | Briere |
| 2009/0078964 A1 | 3/2009 | Briere |
| 2009/0078965 A1 | 3/2009 | Briere |
| 2009/0166677 A1 | 7/2009 | Shibata |
| 2009/0180304 A1 | 7/2009 | Bahramian |
| 2009/0189187 A1 | 7/2009 | Briere |
| 2009/0189191 A1 | 7/2009 | Sato |
| 2009/0194793 A1 | 8/2009 | Briere |
| 2010/0019279 A1 * | 1/2010 | Chen et al. .................... 257/194 |
| 2010/0065856 A1 * | 3/2010 | Briere ............................ 257/76 |
| 2010/0096668 A1 | 4/2010 | Briere |
| 2010/0155781 A1 | 6/2010 | Suzuki |
| 2010/0171126 A1 | 7/2010 | Briere |
| 2010/0301396 A1 * | 12/2010 | Briere .......................... 257/195 |
| 2011/0074375 A1 | 3/2011 | Yang |
| 2011/0080156 A1 | 4/2011 | Briere |
| 2011/0095736 A1 | 4/2011 | Briere |
| 2011/0121313 A1 | 5/2011 | Briere |
| 2011/0136325 A1 | 6/2011 | Briere |
| 2011/0140169 A1 | 6/2011 | Briere |
| 2011/0140176 A1 | 6/2011 | Briere |
| 2011/0198611 A1 | 8/2011 | Cheah |
| 2011/0210337 A1 | 9/2011 | Briere |
| 2011/0210338 A1 | 9/2011 | Briere |
| 2011/0223746 A1 | 9/2011 | Briere |
| 2011/0227090 A1 | 9/2011 | Briere |
| 2011/0227092 A1 | 9/2011 | Briere |
| 2011/0260210 A1 | 10/2011 | Su |
| 2011/0260777 A1 | 10/2011 | Suzuki |
| 2011/0278598 A1 | 11/2011 | Renaud |
| 2011/0284868 A1 | 11/2011 | Briere |
| 2011/0284869 A1 | 11/2011 | Briere |
| 2012/0062199 A1 | 3/2012 | Bahramian |
| 2012/0091470 A1 | 4/2012 | Briere |
| 2012/0138955 A1 | 6/2012 | Ishiguro |
| 2012/0138956 A1 | 6/2012 | Shimizu |
| 2012/0205718 A1 | 8/2012 | Shimizu |
| 2012/0217506 A1 | 8/2012 | Briere |
| 2012/0223327 A1 | 9/2012 | Briere |
| 2012/0223365 A1 | 9/2012 | Briere |
| 2012/0229176 A1 | 9/2012 | Briere |
| 2012/0235209 A1 | 9/2012 | Briere |
| 2012/0241820 A1 | 9/2012 | Briere |
| 2012/0256188 A1 | 10/2012 | McDonald |
| 2012/0256189 A1 | 10/2012 | McDonald |
| 2012/0256190 A1 | 10/2012 | McDonald |
| 2012/0274366 A1 | 11/2012 | Briere |
| 2012/0293147 A1 | 11/2012 | Briere |
| 2013/0015498 A1 | 1/2013 | Briere |
| 2013/0015499 A1 | 1/2013 | Briere |
| 2013/0015501 A1 | 1/2013 | Briere |
| 2013/0015905 A1 | 1/2013 | Briere |
| 2013/0043489 A1 | 2/2013 | Kotani |
| 2013/0069208 A1 | 3/2013 | Briere |
| 2013/0074907 A1 | 3/2013 | Saunders |
| 2013/0105814 A1 | 5/2013 | Briere |

FOREIGN PATENT DOCUMENTS

| | | |
|---|---|---|
| JP | 2009-246045 | 10/2009 |
| JP | 2011-187953 | 9/2011 |
| WO | WO 2008/116038 | 9/2008 |

* cited by examiner

EFFICIENT HIGH VOLTAGE SWITCHING CIRCUITS AND MONOLITHIC INTEGRATION OF SAME

The present application claims the benefit of and priority to a provisional application entitled "Monolithic Integration of Silicon and Group III-V Devices and Efficient Circuits Utilizing Same," Ser. No. 61/339,190 filed on Mar. 1, 2010. The disclosure in that provisional application is hereby incorporated fully by reference into the present application.

BACKGROUND OF THE INVENTION

Definition

In the present application, "group III-V semiconductor" or "group III-V device" or similar terms refers to a compound semiconductor that includes at least one group III element and at least one group V element, such as, but not limited to, gallium nitride (GaN), gallium arsenide (GaAs), indium aluminum gallium nitride (InAlGaN), indium gallium nitride (InGaN) and the like. Analogously, "III-nitride semiconductor" refers to a compound semiconductor that includes nitrogen and at least one group III element, such as, but not limited to, GaN, AlGaN, InN, AlN, InGaN, InAlGaN and the like.

FIELD OF THE INVENTION

The present invention relates generally to high voltage switching circuits and semiconductor device fabrication, and more particularly to high voltage switching circuits using group III-V transistors, and fabrication of group III-V and silicon semiconductor devices.

BACKGROUND ART

Power semiconductor devices are widely used in a variety of electronic devices and systems. Examples of such electronic devices and systems are power supplies and motor controllers including high voltage switching circuits. GaN HEMTs, or generally III-nitride HEMTs, GaN FETs, or III-nitride transistors (and even more generally group III-V transistors), are known and used due to, for example, their high breakdown voltage and high switching speed. In a particular application, a diode, such as a Schottky diode, can be arranged in parallel with a group III-V transistor, where the anode of the diode is connected to the source of the group III-V transistor and the cathode of the diode is connected to the source of the group III-V transistor.

As the performance requirements placed on modern electronic systems grow ever more stringent, power losses within a semiconductor device, as well as factors affecting switching speed, become increasingly important. In high voltage switching circuits, for example, it is desirable for a group III-V transistor to have high breakdown voltage. However, conventionally, the group III-V transistor is provided with high breakdown voltage at the expense of performance capability.

Thus, there is a need to overcome the drawbacks and deficiencies in the art by providing efficient switching circuits with high voltage handling capability and improved performance capability.

SUMMARY OF THE INVENTION

The present invention is directed to efficient high voltage switching circuits and monolithic integration of same, substantially as shown in and/or described in connection with at least one of the figures, and as set forth more completely in the claims.

DETAILED DESCRIPTION OF THE INVENTION

The present invention is directed to efficient high voltage switching circuits and monolithic integration of same. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
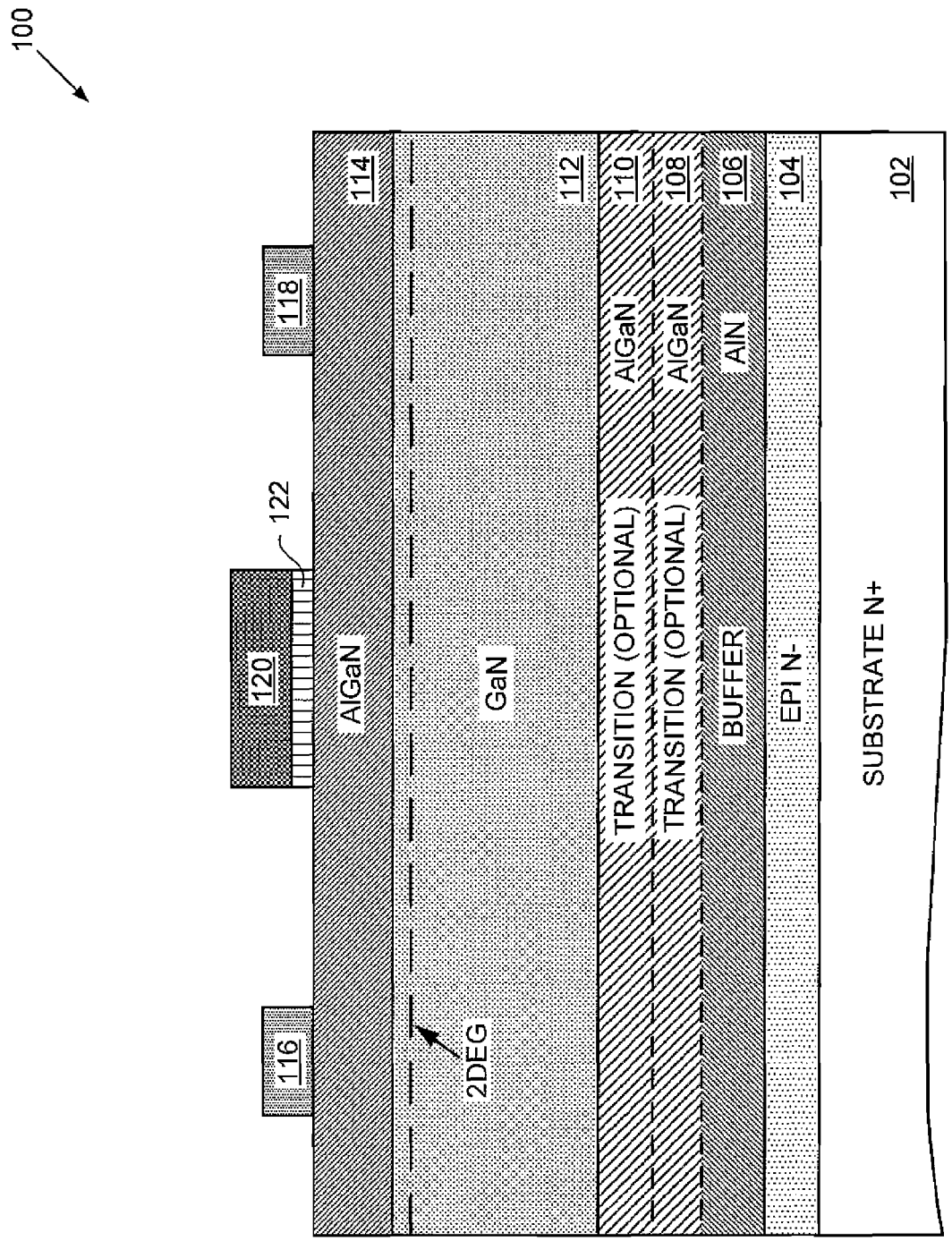
FIG. 1 shows a cross-sectional view of an exemplary group III-V semiconductor device.

FIG. 1 shows a cross-sectional view of exemplary group III-V semiconductor device 100, and more particularly a III-Nitride high electron mobility transistor (HEMT). In other embodiments group semiconductor device 100 can comprise, for example, a III-nitride FET, or other group III-V transistors not specifically discussed herein. Substrate N+ 102 is shown, which can be a silicon layer in a silicon substrate heavily doped with N+ dopants, or it can be a silicon N+ doped layer epitaxially grown on a substrate of sapphire or silicon carbide. A lightly doped epitaxial silicon layer shown as Epi N− layer 104 is formed atop Substrate N+ 102.

As shown in FIG. 1, group semiconductor device 100 further includes buffer layer 106, which can be, for example, an aluminum nitride (AlN) layer, situated over Epi N− layer 104. In group III-V semiconductor device 100, optional transition layers, such as transition layers 108 and 110 having aluminum gallium nitride (AlGaN), can be formed over the AlN layer with varying amounts of aluminum concentration. In the example shown, the aluminum concentration of transition layers 108 and 110 is higher closer to buffer layer 106 and lower closer to GaN layer 112.

Also shown in FIG. 1, gallium nitride (GaN) layer 112 is formed over buffer layer 106 (or over the optional transition layers in some embodiments). Furthermore, a relatively thin AlGaN layer 114 is formed over GaN layer 112. At the interface of AlGaN layer 114 and GaN layer 112 a two-dimensional electron gas (2DEG) is created, as known in the art.

In the present example, group III-V semiconductor device 100 includes source electrode 116, drain electrode 118, and gate electrode 120 formed over gate insulator 122. While FIG. 1 shows an insulated gate, the gate of group III-V semiconductor device 100 does not have to be an insulated gate. For example, in other embodiments the gate can be a Schottky gate. Also, various embodiments of group III-V semiconductor device 100 can be made to operate as a depletion mode device (normally on) or an enhancement mode device (normally off).

Although group III-V semiconductor devices, such as, group III-V semiconductor device 100, are known and used due to, for example, their high breakdown voltage and high switching speed, their fabrication is often not compatible with popular and commonly used silicon devices. Fabrication of group III-V semiconductor devices, for example, GaN (or III-nitride) devices, separate from silicon devices, typically results in two dies (for example a GaN die and a silicon die), which must be interconnected at the package level. The separate dies increase fabrication cost, packaging cost, area consumed on a PC board, and result in increased parasitic inductance, capacitance and resistance due to interconnections required at the packaging level and the PC board level. Moreover, due to increased assembly cost and complexity, and reduced throughput, the separate dies present severe disadvantages.

In one embodiment, the invention provides an efficient high voltage switching circuit comprising III-nitride devices (for example GaN HEMTs) monolithically integrated (i.e. integrated on a common substrate of a common die) with a silicon diode. More particularly, a silicon diode, for example, a silicon Schottky diode, coupled in parallel with the source and drain of a GaN HEMT, where the parallel arrangement of the silicon diode and the GaN HEMT is in cascade with a high voltage GaN HEMT. The resulting monolithically integrated device can be used, for example, in a number of high voltage, high power switching applications. An embodiment of the parallel arrangement of the silicon diode and the GaN HEMT is described with reference to FIGS. 1-3 below.

Figure 2A:
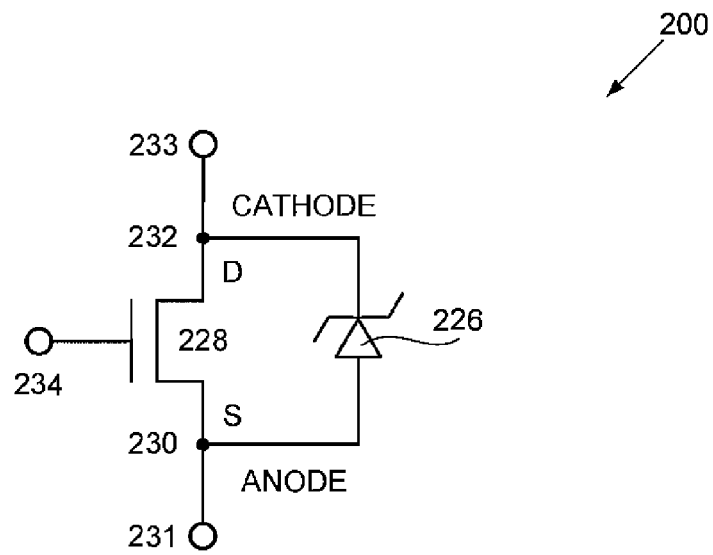
FIG. 2A shows an exemplary circuit, including a silicon device and a group III-V transistor.

Referring now to FIG. 2A, FIG. 2A shows an exemplary circuit, including a silicon device and a group III-V transistor. In FIG. 2A, exemplary circuit 200 comprises silicon Schottky diode 226 coupled in parallel with the source and drain of GaN HEMT 228. As shown in FIG. 2A, the anode of silicon Schottky diode 226 is connected to the source of GaN HEMT 228 at node 230, while the cathode of silicon Schottky diode 226 is connected to the drain of GaN HEMT 228 at node 232. In conventional implementations of circuit 200, Schottky diode 226 and GaN HEMT 228 can comprise discrete electrical components formed on different substrates of different dies. However, in one embodiment of the present invention, silicon Schottky diode 226 and GaN HEMT 228 can be monolithically integrated, for example, as shown and described in relation to FIG. 2B.

Figure 2B:
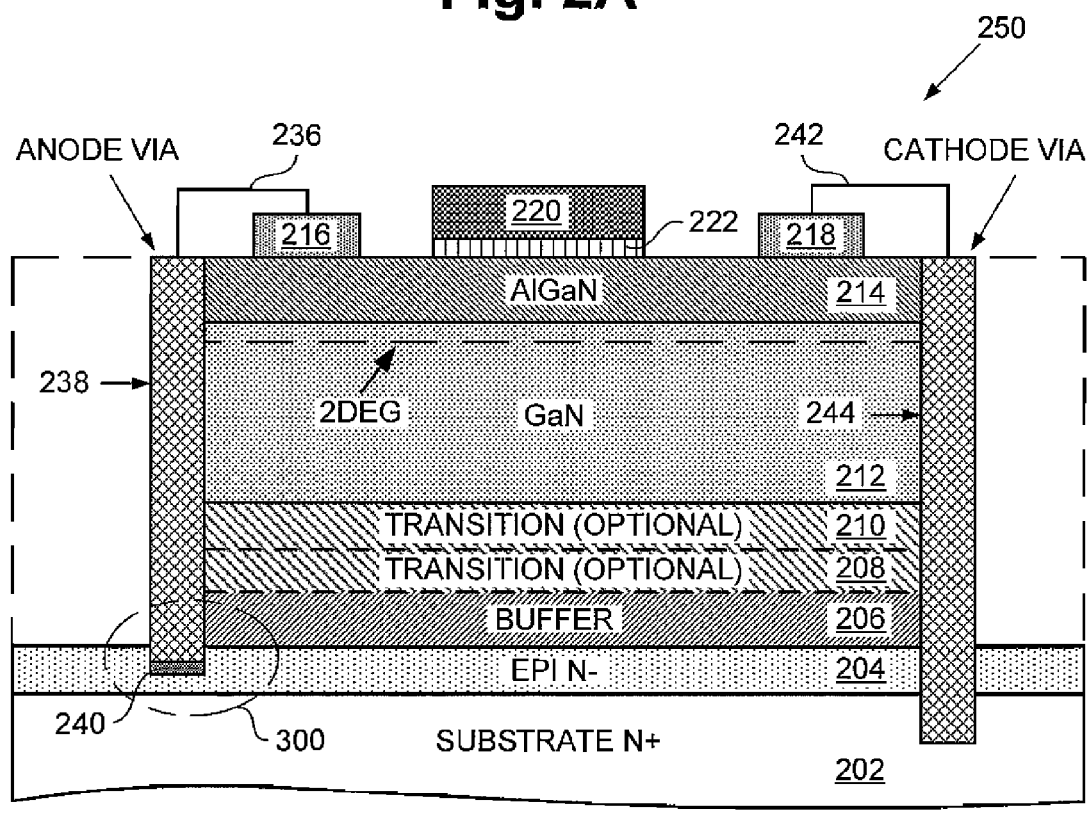
FIG. 2B shows an exemplary monolithically integrated structure, in accordance with one embodiment of the present invention, corresponding to the circuit in FIG. 2A.

Referring to FIG. 2B, FIG. 2B shows an exemplary monolithically integrated structure, in accordance with one embodiment of the present invention, corresponding to the circuit in FIG. 2A. In FIG. 2B GaN HEMT structure 250 includes a group III-V transistor formed over substrate N+ 202. Various features of GaN HEMT structure 250 in FIG. 2B have been discussed in relation to FIG. 1 and are not repeated in relation to FIG. 2B. For example, elements in FIG. 2B can correspond to elements having similar reference numerals in FIG. 1. In other words, AlGaN layer 214, GaN layer 212, and transition layers 210 and 208 can correspond to AlGaN layer 114, GaN layer 112, and transition layers 110 and 108 in FIG. 1 and so on. Although GaN HEMT structure 250 is used as an example, the invention's concepts apply to GaN FETs, as wells as HEMTs and FETs made by use of different III-nitride or group III-V transistor structures.

As shown in FIG. 2B, source 216 of GaN HEMT structure 250 is connected to Epi N− layer 204 (for example a lightly doped region in Si) through interconnect metal connection 236 and via 238, referred to as an "anode via," in FIG. 2B. Metal contact 240, at the bottom of anode via 238, comprises Schottky metal, for example, platinum, aluminum or other appropriate metals.

Figure 3:
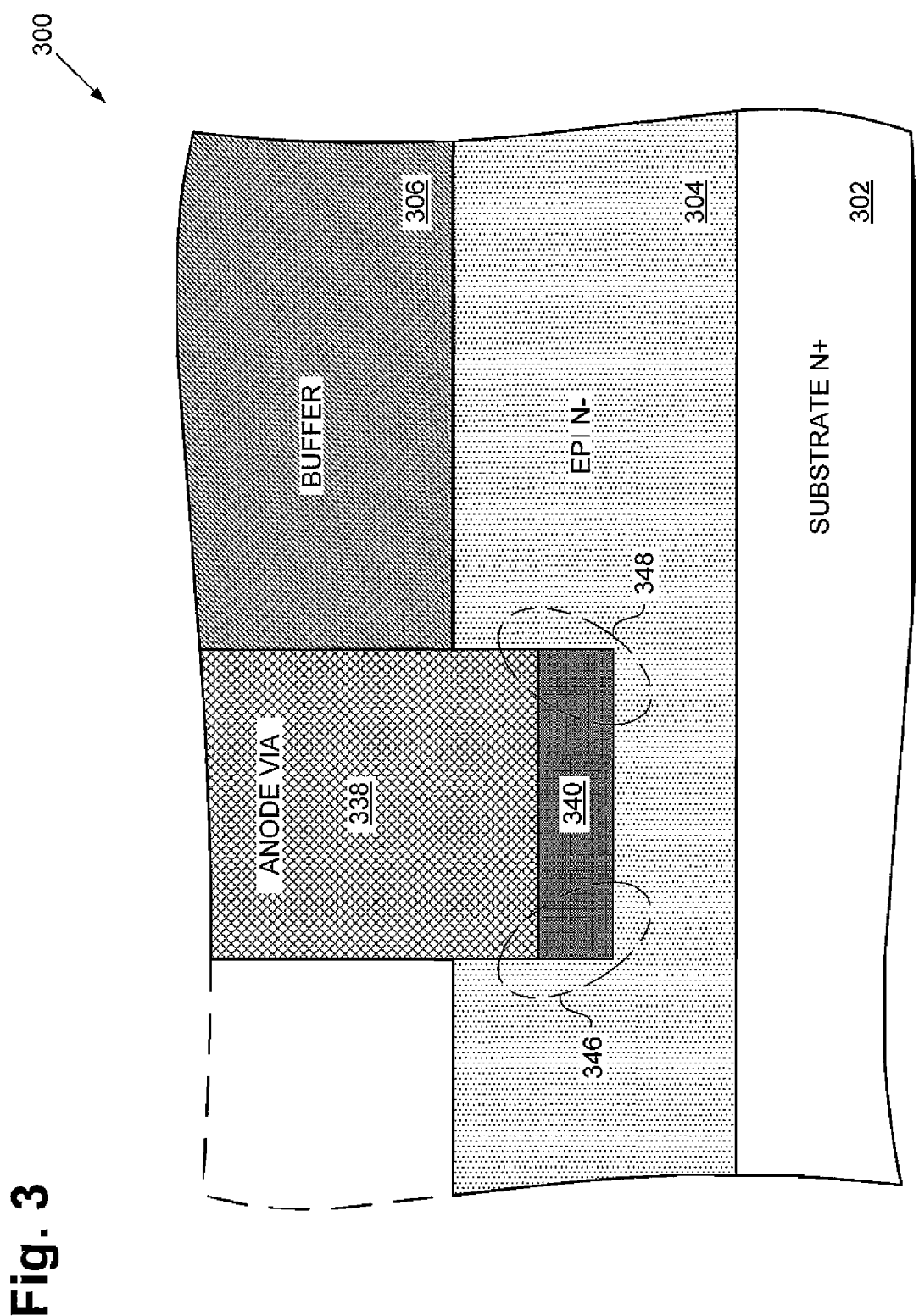
FIG. 3 shows an expanded view of an exemplary monolithically integrated structure, in accordance with one embodiment of the present invention, corresponding to the monolithically integrated structure in FIG. 2B.

A Schottky diode is produced in region 300 of Epi N− layer 204, which is circled in FIG. 2B and shown in more detail as expanded structure 300 in FIG. 3. Drain 218 of GaN HEMT structure 250 is connected through interconnect metal connection 242 and via 244, referred to as a "cathode via," to substrate N+ 202, for example to an N+ silicon layer 202. Thus, the anode of silicon Schottky diode 226 in FIG. 2A can correspond to metal contact 240, and the cathode of silicon Schottky diode 226 in FIG. 2A can correspond to substrate N+ 202 connected to drain 218 through cathode via 244.

In GaN HEMT structure 250, anode via 238 extends along the group III-V transistor to contact the anode of the silicon diode and cathode via 244 and cathode via 244 extends along the group transistor to contact the cathode of the silicon diode. Anode and cathode vias 238 and 244 generally do not have the same depth. It is preferable that metal contact 240 contact Epi N− layer 204 instead of substrate N+ 202, since the interface of metal contact 240 and substrate N+ 202 would have too high of a reverse bias leakage current and would also have reduced break down voltage. Thus, metal contact 240 can interface with Epi N− layer 204 to produce good Schottky contact and to support a higher breakdown voltage. Epi N− layer 204 can be, for example, about 0.5 to 10 microns thick. By making Epi N− layer 204 thicker, the breakdown voltage of the device can be increased.

It is noted that in FIG. 2A, the source of GaN HEMT 228 is coupled to the anode of silicon Schottky diode 226 at node 230, which can correspond to connection 236 in FIG. 2B. Connection 236 can be made by use of contacts and interconnect metal in various forms and layouts and techniques as known in the art. Similarly, in FIG. 2A the drain of GaN HEMT 228 is coupled to the cathode of silicon Schottky diode 226 at node 232, which can correspond to connection 242 in FIG. 2B. Connection 242 can be made by use of contacts and interconnect metal in various forms and layouts and techniques as known in the art. It is also noted that, similar to group III-V semiconductor device 100 in FIG. 1, GaN HEMT structure 250 in FIG. 2B can be an enhancement mode or depletion mode FET.

To further improve breakdown voltage, for example, to raise breakdown voltage above 30 or 40 volts, reference is made to FIG. 3, which shows an expanded view of region 300 showing the Schottky diode structure in more detail. In FIG. 3, substrate N+ 302, Epi N− layer 304, buffer 306, anode via 338, and metal contact 340 correspond respectively to substrate N+ 202, Epi N− layer 204, buffer layer 206, anode via 238, and metal contact 240 in FIG. 2.

To overcome early breakdown at corners 346 and 348 of the Schottky diode, P+ regions, for example, angled P+ implants can be used near corners 346 and 348 where metal contact 340 would be deposited. According to a preferred method, immediately prior to filling anode via 338, P+ angled implanting is performed at corners 346 and 348 of the trench. Typical P+ dopants, such as Boron can be used. The sealing of corners 346 and 348 with P+ regions results in a "merged Schottky" device, which combines a PN junction with the Schottky diode. Instead of implanting P+ dopants, the center region of the anode can be blocked or masked so that P+ dopants can only diffuse into the corners of the region where metal contact 340 would interface with Epi N− layer 304. The combined device is a Schottky diode with PN junctions at corners 346 and 348. There is still a Schottky action in the center of metal contact 340 situated between the P+ regions.

P+ regions at corners 346 and 348 increase breakdown voltage capability for two reasons. First, the PN junctions (i.e. at corners 346 and 348) help spread-out the electric field to reduce electric field crowding at corners 346 and 348. Second, when the Schottky diode is reverse biased, there would be extended depletion regions near corners 346 and 348 at the P+ regions, which pinch off the Schottky diode and reduce the reverse leakage current so that higher voltages can be used due to a lower leakage current and higher breakdown voltage of this merged Schottky diode and PN junction configuration. In a particular example, P+ regions at corners 346 and 348 can raise breakdown voltage of the Schottky diode to 100 volts or more.

It is noted that use of a silicon Schottky diode, as opposed to a GaN Schottky diode presents advantages. For example, the forward bias voltage of the silicon Schottky diode is much lower than the forward bias voltage of a GaN Schottky diode. Moreover, to make GaN Schottky diodes, metals such as gold or copper or nickel are needed for Schottky metal in metal contact 340, which are not generally compatible with silicon CMOS processing. The monolithic integrated device of the present invention can however be fabricated in a silicon CMOS fabrication facility resulting in significant cost savings.

Figure 4:
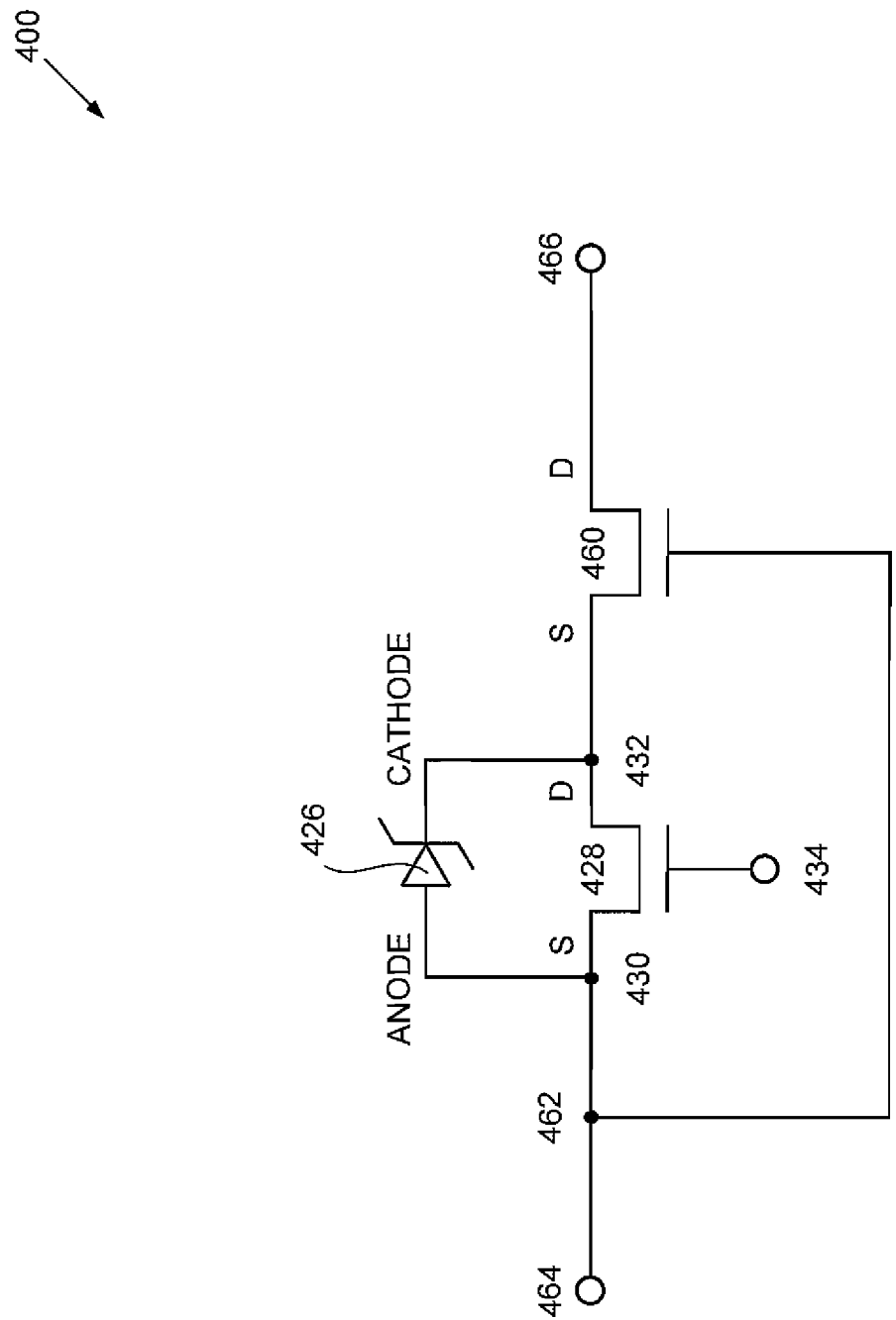
FIG. 4 shows an efficient high voltage switching circuit, in accordance with one embodiment of the present invention.

FIG. 4 shows an efficient high voltage switching circuit, in accordance with one embodiment of the present invention. As shown in FIG. 4, circuit 400 employs GaN HEMTs or GaN FETs (or other III-nitride or group III-V transistors) 428 and 460 and silicon Schottky (or PN junction) diode 426. Silicon Schottky diode 426 can be integrated, and in one embodiment is integrated, with GaN device 428 and 460 shown in FIG. 4 in a manner described above in relation to FIGS. 1 through 3. Moreover, various structures not shown in relation to FIG. 4 can be similar to those described in relation to FIGS. 1, 2B, and 3.

Referring to FIG. 4, GaN device 428, which can be, for example, a GaN HEMT or GaN FET, can be an enhancement mode or depletion mode transistor, although GaN device 428 is preferably an enhancement mode transistor. GaN device 428 is a "low to medium" voltage GaN device, with breakdown voltage in the range of 10 to 50 volts. High voltage GaN device 460 typically has a breakdown voltage of over 100 volts (for example 100 to 1200 volts), and can be either an enhancement mode of depletion mode device, but it is preferably a depletion mode device.

As shown in FIG. 4, GaN device 428 is in parallel with silicon diode (silicon Schottky or PN junction diode) 426. The parallel arrangement of silicon diode 426 and GaN device 428 is in cascade with high voltage GaN device 460 and the gate of high voltage GaN device 460 is coupled to the source of GaN device 428 at node 462. Circuit 400 is shown having three terminals which can be connected to external circuits: terminal 464 connected to node 462, terminal 434 connected to the gate of GaN HEMT 428, and terminal 466 connected to the drain of GaN HEMT 460. It is noted that the silicon/GaN semiconductor structure integration discussed in relation to FIGS. 1 through 3 can apply to the circuit of FIG. 4.

In accordance with the present invention, circuit 400 in FIG. 4 can be implemented as a monolithic (using a single die or a common or single substrate), cascaded, normally off high voltage switch. Thus, low voltage high efficiency silicon diode 426 (which can be either a Schottky or a PN junction diode) is in parallel with high performance low to medium voltage GaN device 428, which, in some embodiments, can correspond to GaN HEMT structure 250 in FIG. 2B. The cascaded combination of silicon diode 426 and GaN device 428 with high voltage GaN device 460 results in high voltage handling capability, while using a high performance switch based on the parallel arrangement of two high performance devices silicon diode 426 and GaN device 428. Thus, the end result is a high voltage switch with performance capability and input gate characteristics of a low voltage device. Furthermore, since circuit 400 is implemented as a monolithically integrated circuit, it incorporates various advantages discussed in relation to FIGS. 1 through 3, and it overcomes the disadvantages of two separate dies discussed above. For example, the monolithic structure corresponding to circuit 400 is much easier to package, and eliminates the parasitic inductance between the source of high voltage GaN device 460, and drain of low voltage GaN device 428.

Figures 5A, 5B:
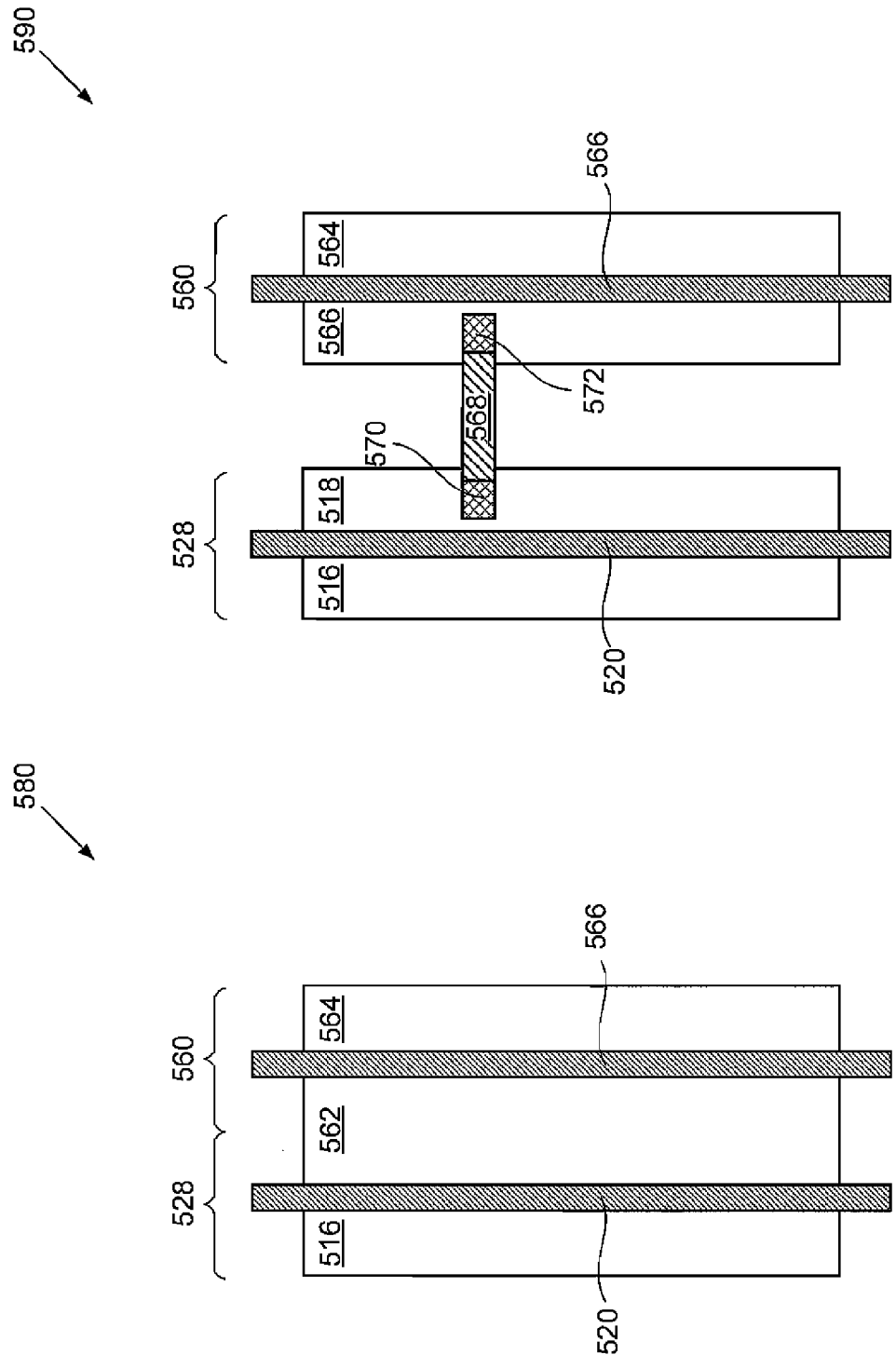
FIG. 5A shows one embodiment of an integrated structure corresponding to a further integration of the circuit of FIG. 4 at a layout or floor plan level.
FIG. 5B shows another embodiment of an integrated structure corresponding to a further integration of the circuit of FIG. 4 at a layout or floor plan level.

FIG. 5A shows monolithically integrated structure 580, corresponding to an implementation of the circuit in FIG. 4, in accordance with one embodiment of the present invention. More particularly, FIG. 5A shows integrated structure 580 corresponding to a further integration of circuit 400 of FIG. 4 at a layout or floor plan level (which can be employed in addition to the structural integration shown and described in relation to FIGS. 1 through 3). Integrated structure 580 includes GaN devices 528 and 560 corresponding respectively to GaN devices 428 and 460 in FIG. 4.

In integrated structure 580, GaN device 528 includes source 516 and gate 520 and GaN device 560 includes drain 564 and gate 566. Integrated structure 580 further includes shared source/drain 562, where the source of GaN device 560 is shared on a layout level with the drain of GaN device 528, resulting in an enhanced level of integration.

In FIG. 5A, a portion of the interdigitated source, gate, and drain fingers of the laid out GaN device 528 and GaN device 560 is shown. As known in the art, the interdigitated configuration of FIG. 5A can be repeated many times to arrive at the desired transistor size, but only one instance of the interdigitated configuration is shown in FIG. 5A. As noted above, the drain of GaN 528 and source of GaN 560 are shared in region 562. This technique not only reduces the area consumed on the die, but also eliminates inductive and resistive parasitics that would otherwise exist in connecting the drain of GaN 528 to the source of GaN 560. The elimination of such inductive and resistive parasitics results in, for example, reducing noise and ringing and increases stability and enhances the performance of circuit 400 in FIG. 4. Thus, according to one embodiment, the disadvantages associated with two separate dies can be eliminated (due to the silicon/GaN integration scheme discussed in relation to FIGS. 1 through 3), while achieving a further level of integration using the layout shown in FIG. 5A.

Referring now to FIG. 5B, FIG. 5B shows monolithically integrated structure 590, corresponding to an implementation of the circuit in FIG. 4, in accordance with one embodiment of the present invention. In FIG. 5B, a portion of the interdigitated source, gate, and drain fingers of the laid out GaN device 528 and GaN device 560 is shown. As known in the art, the interdigitated configuration of FIG. 5B is repeated many times to arrive at the desired transistor size, but only one instance of the interdigitated configuration is shown in FIG.

5B. In the embodiment shown in FIG. 5B, drain 518 of GaN device 528 and source 566 of GaN device 560 are connected to each other by interconnect metal segments, such as interconnect metal segment 568 and contacts 570 and 572. Typically a large number of metal segments are used, but only one example of such metal segments is shown in FIG. 5B. According to FIG. 5B, the various disadvantages associated with two separate dies are eliminated due to the silicon/GaN integration scheme discussed in relation to FIGS. 1 through 3, and only a small amount of inductive and resistive parasitics are present due to the connection between drain 518 of GaN 528 and source 566 of GaN 560.

Thus, according to various embodiments as discussed above, the present invention achieves an efficient high voltage switching circuit. In one embodiment, a silicon diode is coupled in parallel with the source and drain of a GaN HEMT, where the parallel arrangement of the silicon diode and the GaN HEMT is in cascade with a high voltage GaN HEMT. The resulting switching circuit can provide high voltage handling capability, performance capability, and input gate characteristics. By forming the switching circuit monolithically, fabrication cost, packaging cost, and area consumed on a PC board can be reduced. Furthermore, parasitic inductance, capacitance, and resistance can be reduced by removing interconnections at the packaging level and the PC board level. In one particular example, the invention further reduces the area consumed on the die and eliminates inductive and resistive parasitics resulting in, for example, reduced noise and ringing, increased stability, and enhanced performance of the switching circuit.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A high voltage switching circuit comprising:
   first and second group III-V transistors, said second group III-V transistor having a greater breakdown voltage than said first group III-V transistor;
   a silicon diode in a parallel arrangement with said first group III-V transistor, said parallel arrangement in cascade with said second group III-V transistor;
   a first terminal directly coupled to a gate of said second group III-V transistor, a source of said first group III-V transistor, and an anode of said silicon diode, a second terminal coupled to a gate of said first group III-V transistor, and a third terminal coupled to a drain of said second group III-V transistor, said first terminal not directly coupled to said second terminal.

2. The high voltage switching circuit of claim 1, wherein said first group III-V transistor comprises an enhancement mode transistor.

3. The high voltage switching circuit of claim 1, wherein said second group III-V transistor comprises a depletion mode transistor.

4. The high voltage switching circuit of claim 1, wherein each of said first and second group III-V transistors is a GaN HEMT.

5. The high voltage switching circuit of claim 1, wherein said first group III-V transistor comprises a low to medium voltage group III-V transistor and said second group III-V transistor comprises a high voltage group III-V transistor.

6. The high voltage switching circuit of claim 1, wherein said silicon diode comprises a Schottky diode.

7. The high voltage switching circuit of claim 1, wherein said silicon diode comprises a PN junction diode.

8. The high voltage switching circuit of claim 1, wherein said silicon diode and said first and second group III-V transistors are monolithically integrated on a common substrate.

9. The high voltage switching circuit of claim 8, wherein said source of said second group III-V transistor is shared with said drain of said first group III-V transistor.

10. A high voltage switching circuit comprising:
    first and second group III-V transistors, said second group III-V transistor having a greater breakdown voltage than said first group III-V transistor;
    a silicon diode in a parallel arrangement with a source and a drain of said first group III-V transistor, said parallel arrangement in cascade with said second group III-V transistor;
    a first terminal directly coupled to a gate of said second group III-V transistor, said source of said first group III-V transistor and an anode of said silicon diode, and a second terminal coupled to a gate of said first group III-V transistor, said first terminal not directly coupled to said second terminal;
    an epitaxial layer over a common substrate, wherein said anode of said silicon diode is situated within said epitaxial layer below a heterojunction of said first group III-V transistor; and
    wherein said silicon diode and said first and second group III-V transistors are monolithically integrated on said common substrate.

11. The high voltage switching circuit of claim 10, wherein a source of said second group III-V transistor is shared with said drain of said first group III-V transistor.

12. The high voltage switching circuit of claim 10, wherein a cathode of said silicon diode is situated within said common substrate, said first and second group III-V transistors being formed over said common substrate.

13. The high voltage switching circuit of claim 10, wherein said first group III-V transistor comprises an enhancement mode transistor.

14. The high voltage switching circuit of claim 10, wherein said second group III-V transistor comprises a depletion mode transistor.

15. The high voltage switching circuit of claim 10, wherein each of said first and second group III-V transistors is a GaN HEMT.

16. The high voltage switching circuit of claim 10, wherein said first group transistor comprises a low to medium voltage group transistor and said second group transistor comprises a high voltage group III-V transistor.

17. The high voltage switching circuit of claim 10, wherein said silicon diode comprises a Schottky diode.

18. The high voltage switching circuit of claim 10, wherein said silicon diode comprises a PN junction diode.

* * * * *